US00RE40920E

(19) United States
(12) Reissued Patent
Xu et al.

(10) Patent Number: US RE40,920 E
(45) Date of Reissued Patent: Sep. 22, 2009

(54) ANTI-REFLECTIVE COATINGS AND DUAL DAMASCENE FILL COMPOSITIONS COMPRISING STYRENE-ALLYL ALCOHOL COPOLYMERS

(75) Inventors: Gu Xu, Rolla, MO (US); Jimmy D. Meador, Ballwin, MO (US); Mandar R. Bhave, Austin, TX (US); Shreeram V. Deshpande, Ballwin, MO (US); Kelly A. Nowak, Rolla, MO (US)

(73) Assignee: Brewer Science Inc., Rolla, MO (US)

(21) Appl. No.: 11/799,470

(22) Filed: May 1, 2007

Related U.S. Patent Documents

Reissue of:
(64) Patent No.: 6,894,104
Issued: May 17, 2005
Appl. No.: 10/154,338
Filed: May 23, 2002

(51) Int. Cl.
*C08L 29/06* (2006.01)

(52) U.S. Cl. ..... 524/503; 524/376; 524/379; 524/365; 524/315; 524/502; 430/270.1; 430/286.1; 430/950; 430/935

(58) Field of Classification Search ..... 524/503, 524/376, 379, 365, 315, 502; 430/270.1, 430/286.1, 950, 935
See application file for complete search history.

(56) References Cited

U.S. PATENT DOCUMENTS

| | | | | |
|---|---|---|---|---|
| 3,407,155 | A | 10/1968 | Casebolt | |
| 3,454,418 | A * | 7/1969 | Forsberg | 428/416 |
| 4,090,936 | A | 5/1978 | Barton | |
| 4,808,652 | A | 2/1989 | Gardner | |
| 5,089,313 | A * | 2/1992 | Cope | 428/151 |
| 5,157,080 | A * | 10/1992 | Gardner et al. | 525/134 |
| 5,284,737 | A | 2/1994 | Jayaraman et al. | |
| 6,187,506 | B1 | 2/2001 | Ding et al. | |
| 6,410,209 | B1 | 6/2002 | Adams et al. | |
| 6,482,751 | B2 | 11/2002 | Lee et al. | |
| 2002/0031729 | A1 | 3/2002 | Trefonas III et al. | |
| 2002/0195419 | A1 | 12/2002 | Pavelchek | |

FOREIGN PATENT DOCUMENTS

| | | |
|---|---|---|
| EP | 0357582 | 3/1990 |
| EP | 0 458772 A2 * | 11/1991 |
| EP | 0458772 | 11/1991 |
| EP | 0497020 | 5/1992 |
| JP | 09-236915 | 9/1997 |
| JP | 09-244238 | 9/1997 |
| JP | 2001-53068 | 2/2001 |
| JP | 2002-72489 | 3/2001 |
| WO | WO 00/29906 | 5/2000 |
| WO | WO 00/53645 | 9/2000 |
| WO | WO 00/54105 | 9/2000 |

OTHER PUBLICATIONS

Arco Chemical launches alcohol derivatives worldwide. Chem. Mark. Rep., vol. 245. No. 16, Apr. 18, 1994, pp. 21, Journal, Column,. ISSN 00900907, English, nerac.com, 1 page.

Do, Phong et al., "Optimized filtration for reduced defectivity and improved dispense recipe in 193 nm BARC lithography," SPIE, 2004, pp. 1–8.

* cited by examiner

*Primary Examiner*—Ling-Siu Choi
(74) *Attorney, Agent, or Firm*—Hovey Williams LLP

(57) ABSTRACT

New anti-reflective or fill compositions having improved flow properties are provided. The compositions comprise a styrene-allyl alcohol polymer and preferably at least one other polymer (e.g., cellulosic polymers) in addition to the styrene-allyl alcohol polymer. The inventive compositions can be used to protect contact or via holes from degradation during subsequent etching in the dual damascene process. The inventive compositions can also be applied to substrates (e.g., silicon wafers) to form anti-reflective coating layers having high etch rates which minimize or prevent reflection during subsequent photoresist exposure and developing.

11 Claims, 7 Drawing Sheets

ANTI-REFLECTIVE COATINGS AND DUAL DAMASCENE FILL COMPOSITIONS COMPRISING STYRENE-ALLYL ALCOHOL COPOLYMERS

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention is concerned with new anti-reflective compositions and via fill compositions for use in the manufacture of microelectronic devices. These compositions include a polymer and a styrene-allyl alcohol polymer dispersed in a solvent system.

2. Description of the Prior Art

1. Anti-Reflective Coatings

Integrated circuit manufacturers are consistently seeking to maximize substrate wafer sizes and minimize device feature dimensions in order to improve yield, reduce unit case, and increase on-chip computing power. Device feature sizes on silicon or other chips are now submicron in size with the advent of advanced deep ultraviolet (DUV) microlithographic processes.

However, a frequent problem encountered by photoresists during the manufacturing of semiconductor devices is that activating radiation is reflected back into the photoresist by the substrate on which it is supported. Such reflectivity tends to cause blurred patterns which degrade the resolution of the photoresist. Degradation of the image in the processed photoresist is particularly problematic when the substrate is non-planar and/or highly reflective. One approach to address this problem is the use of an anti-reflective coating applied to the substrate beneath the photoresist layer.

Compositions which have high optical density at the typical exposure wavelengths have been used for some time to form these anti-reflective coating layers. The anti-reflective coating compositions typically consist of an organic polymer which provides coating properties and a dye for absorbing light. The dye is either blended into the composition or chemically bonded to the polymer. Thermosetting anti-reflective coatings contain a crosslinking agent in addition to the polymer and dye. Crosslinking must be initiated, and this is typically accomplished by an acid catalyst present in the composition.

While these anti-reflective coatings are effective at lessening the amount of light reflected back into the photoresist, most prior art anti-reflective coatings are lacking in that they do not have a sufficiently high etch rate. As a result, prior art anti-reflective coatings present significant limitations which make them difficult or impossible to use on submicron (e.g., 0.3 μm) features.

2. Fill Compositions

The damascene process, or the process of forming inlaid metal patterning in preformed grooves, is generally a preferred method of fabricating interconnections for integrated circuits. In its simplest form, the dual damascene process starts with an insulating layer which is first formed on a substrate and then planarized. Horizontal trenches are vertical holes (i.e., the contact and via holes) are then etched into the insulating layer corresponding to the required metal line pattern and hole locations that will descend down through the insulating layer to the device regions (if through the first insulating layer, i.e., a contact hole) or to the next metal layer down (if through an upper insulating layer in the substrate structure, i.e., a via hole). Metal is next deposited over the substrate, thereby filling the trenches and the holes and forming the metal lines and interconnect holes simultaneously. As a final step, the resulting surface is planarized (e.g., by the known chemical-mechanical polish (CMP) technique) and readied to accept another damascene structure.

During the dual damascene process, the contact and via holes are typically etched to completion prior to the trench etching. Thus, the step of trench etching exposes the bottom and sidewalls (which are formed of the insulating or dielectric layer) of the contact or via holes to over-etch which can deteriorate contact with the base layer. An organic material is typically used to partially or completely fill the via or contact holes and to protect the bottom and sidewalls from further etch attack. These organic fill materials can also serve as a bottom anti-reflective coating (as discussed above) to reduce or eliminate pattern degradation and linewidth variation in the patterning of the trench layer, provided the fill material covers the surface of the dielectric layer.

Fill materials which have high optical density at the typical exposure wavelengths have been used for the past several years. However, most prior art materials have limited fill properties. For example, when the prior art compositions are applied to the via or contact holes formed within the substrate, the films formed by the compositions tend to be quite thin on the substrate surface immediately adjacent the holes, thus leading to undesirable light reflection during subsequent exposure steps. Also, the flow properties of the composition tend to be lacking in that the composition does not completely flow into via and contact holes, resulting in inadequate protection of those holes.

There is a need in the art for contact or via hole fill materials which provide complete coverage at the top of via and contact holes. Furthermore, this material should properly flow into the via and contact holes to protect the base during etching and prevent degradation of the barrier layer and damage to the underlying metal conductors. There is also a need for improved anti-reflective coatings which can be effectively utilized to form integrated circuits having submicron features while also absorbing light at the wavelength of interest.

SUMMARY OF THE INVENTION

The present invention broadly comprises new fill compositions and anti-reflective coating compositions that are useful for the manufacture of microelectronic devices.

In more detail, the compositions comprise at least one styrene-allyl alcohol polymer and preferably at least one further polymer other than the styrene-allyl alcohol polymer. The composition should comprise from about 1–10% by weight styrene-allyl alcohol polymer, more preferably from about 1–6% by weight styrene-allyl alcohol polymer, and even more preferably from about 1–4% by weight styrene-allyl alcohol polymer, based upon the total weight of the composition taken as 100% by weight.

The styrene-allyl alcohol polymer should comprise from about 40–90% by weight styrene, preferably from about 60–82% by weight styrene, and more preferably from about 70–81% by weight styrene, based upon the total weight of the styrene-allyl alcohol polymer taken as 100% by weight. Also, the styrene-allyl alcohol polymer should comprise from about 10–60% by weight allyl alcohol, preferably from about 18–40% by weight allyl alcohol, and more preferably from about 19–30% by weight allyl alcohol, based upon the total weight of the styrene-allyl alcohol polymer taken as 100% by weight.

In one embodiment, the molar ratio of styrene to allyl alcohol in the composition is from about 0.4:1 to about 4:1, preferably from about 1:1 to about 2.7:1, and more preferably from about 1.2:1 to about 2.5:1. The weight average molecular weight of the styrene-allyl alcohol polymer is preferably from about 1000–10,000 Daltons, and more preferably from about 1000–5000 Daltons. Two particularly preferred commercially available styrene-allyl alcohol polymers are SAA-100 and SAA-101 (available from Lyondell Chemical).

In those embodiments where another polymer (hereinafter referred to as "additional polymer") is used along with the styrene-allyl alcohol polymer, preferred additional polymers include those selected from the group consisting of novolaks, acrylics, cellulose, polyacrylics (e.g., polyacrylic acid), polystyrenes (e.g., polystyrene maleic anhydride), and mixtures thereof. The weight average molecular weight of these additional polymers is preferably from about 1000–10,000 Daltons, and more preferably from about 1000–70,000 Daltons. Preferably, the composition comprises from about 0.5–10% by weight of this additional polymer, more preferably from about 0.5–4% by weight, and even more preferably from about 0.5–3% by weight, based upon the total weight of the composition taken as 100% by weight. The weight ratio of styrene-allyl alcohol polymer to additional polymer in this embodiment is preferably from about 10:90 to about 90:10, and more preferably from about 30:70 to about 90:10.

The compositions are formed by simply dispersing or dissolving the styrene-allyl alcohol polymer(s) (in quantities as set forth above) in a suitable solvent system, preferably at ambient conditions and for a sufficient amount of time to form a substantially homogeneous dispersion. Preferred solvent systems include a solvent selected from the group consisting of propylene glycol methyl ether acetate (PGMEA), propylene glycol methyl ether (PGME), propylene glycol n-propyl ether (PnP), 2-heptanone, N-methylpyrollidinone, ethyl lactate, and mixtures thereof. Preferably, the solvent system has a boiling point of from about 100–180° C., and more preferably from about 118–175° C. The solvent system should be utilized at a level of from about 80–98% by weight, and preferably from about 90–97% by weight, based upon the total weight of the composition taken as 100% by weight.

Any additional ingredients are also preferably dispersed in the solvent system along with the styrene-allyl alcohol. For example, the inventive compositions can further comprise a crosslinking agent, a catalyst, and an additional polymer as discussed above. The crosslinking agent can be separate from the polymer(s) present in the composition or, alternately, the polymer(s) can include "built-in" crosslinking moieties. Preferred crosslinking agents include aminoplasts (e.g., POWDERLINK® 1174, Cymel® products). The crosslinking agent or moieties should be present in the composition at a level of from about 0.2–2.5% by weight, and preferably from about 0.3–1.8% by weight, based upon the total weight of the composition taken as 100% by weight. Thus, the compositions of the invention should crosslink at a temperature of from about 180–220° C., and more preferably from about 190–210° C.

Preferred catalysts include those selected from the group consisting of p-toluenesulfonic acid, bisphenol-A, 4,4'-sulfonyldiphenol, pyridinium p-toluenesulfonate, and mixtures thereof. The catalyst should be present in the composition at a level of from about 0.02–0.45% by weight, and preferably from about 0.05–0.35% by weight, based upon the total weight of the composition taken as 100% by weight.

It will be appreciated that a number of other optional ingredients can be included in the composition as well. Typical optional ingredients include light attenuating compounds, surfactants, and adhesion promoters.

The method of applying the fill or anti-reflective coating compositions to a substrate (e.g., a silicon wafer) simply comprises applying a quantity of a composition hereof to the substrate surface by any conventional application method (including spin-coating). Advantageously, after the composition is applied to the hole, it is not necessary to subject it to a first stage bake process (i.e., heating the composition to its reflow temperature) so as to cause the composition to flow into the contact or via holes. That is, the styrene-allyl alcohol sufficiently improves the flow properties of the composition that this is not needed as was the case with prior art compositions.

After the desired coverage is achieved, the resulting layer should be heated to at least about the crosslinking temperature (e.g., 120–225° C.) of the composition so as to cure the layer. The degree of leveling of the cured material in any contact or via holes should be at least about 85%, preferably at least about 90%, and more preferably at least about 95%. As used here, the degree of leveling is determined as follows (where 100% means that complete leveling was achieved):

$$\text{Degree of leveling} = \left(\frac{1 - (\text{height of meniscus "M"})}{\text{height "H" of the hole}}\right) \times 100.$$

where "M" and "H" are measurements taken from the cured material as shown in FIG. 1 where 10 represents the cured material in the hole 12. Specifically, "H" represents the height of the particular hole, and "M" represents the meniscus of the composition in the hole.

The thickness of the cured fill material layer on the surface of the substrate adjacent the edge of a contact or via hole should be at least 50%, preferably at least about 55%, and more preferably at least about 65% of the thickness of the film on the substrate surface a distance away from the edge of the contact or via hole approximately equal to the diameter of the hole.

Anti-reflective coatings according to the invention have a high etch rate. Thus, the anti-reflective coatings have an etch selectivity to resist (i.e., the anti-reflective coating layer etch rate divided by the photoresist etch rate) of at least about 0.9, and preferably at least about 1.2, when $HBr/O_2$ (60/40) is used as the etchant. Additionally, at 193 mm the inventive anti-reflective coating layers have a k value (i.e., the imaginary component of the complex index of refraction) of at least about 0.25, and preferably at least about 0.35, and have an n value (i.e., the real component of the complex index of refraction) of at least about 1.5, and preferably at least about 1.6. That is, a cured layer formed from the inventive composition will absorb at least about 97%, and preferably at least about 99% of light at a wavelength of 193 nm.

Furthermore, the inventive anti-reflective coatings will be substantially insoluble in typical photoresist solvents (e.g., ethyl lactate). When subjected to a stripping test, the inventive anti-reflective coating layers will have a percent stripping of less than about 5%, and preferably less than about 1%. The stripping test involves puddling a solvent (e.g., ethyl lactate) onto the cured film for 5–10 seconds, followed by spin drying at 5000 rpm for 30 seconds to remove the solvent. The film is then baked on a hotplate at 100° C. for 30 seconds. The film thickness is measured at multiple points on the wafer using ellipsometry. The amount of strip ping is the difference between the initial and final average film thicknesses. The percent stripping is:

$$\%\ \text{stripping} = \left(\frac{\text{amount of stripping}}{\text{initial average film thickness}}\right) \times 100.$$

A photoresist can be applied to the cured material, followed by drying (soft bake), exposing, post-exposure baking, and developing the photoresist. Following the methods of the invention will yield precursor structures for dual damascene and other microlithographic processes which have the foregoing desirable properties.

Finally, the present invention also provides a method of adjusting the flow of a subject composition, regardless of whether that composition is an anti-reflective coating composition, a fill composition, or some other type of composition. In this method, one or more flow characteristics (e.g., viscosity) is evaluated by a known method to determine whether it is suitable for its intended use. If it is not, a quantity of styrene-allyl alcohol polymer is mixed with the subject composition in sufficient quantities to obtain the desired flow characteristic. It will be appreciated that this quantity will depend upon the nature of the subject composition, but can easily be determined by one of ordinary skill in the art by observing the changes in the flow characteristics upon mixing of the styrene-allyl alcohol polymer with the composition.

After mixing the styrene-allyl alcohol polymer(s) with the subject composition, it is preferred that the flow characteristic of interest be re-evaluated, and the mixing and re-evaluating steps be repeated until the desired flow characteristics are achieved. Styrene-allyl alcohol polymers have been discovered to be particularly useful for improving and increasing the flowability of a composition so that it evenly flows over a surface, even when the surface is highly topographic.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention.

Example 1

In this procedure, 5 g of SAA-101 polymer (a styrene-allyl alcohol copolymer from Lyondell Chemical, weight-average molecular weight: 2,500) was mixed with 0.5 g of POWDERLINK® 1174 (a crosslinking agent obtained from Cytec Industries, Inc.), 0.10 g of p-toluenesulfonic acid (TSA) and 181.07 g of PGME. A polymer solution was obtained after stirring for 2 hours. The solution was ion exchanged for two hours to minimize metals and filtered twice with a 0.1 μm end point filter.

Figure 1:
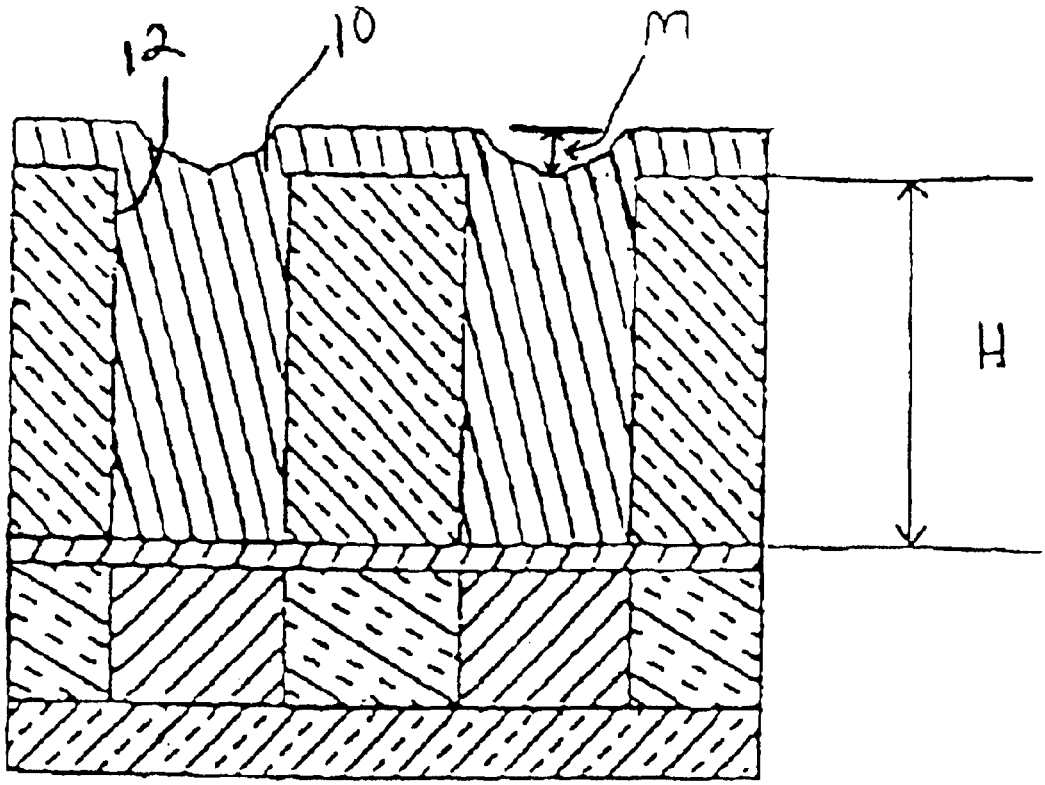
FIG. 1 is a cross-sectional view of a substrate having via holes formed therein where the holes are filled with a fill composition.
Figure 2A:
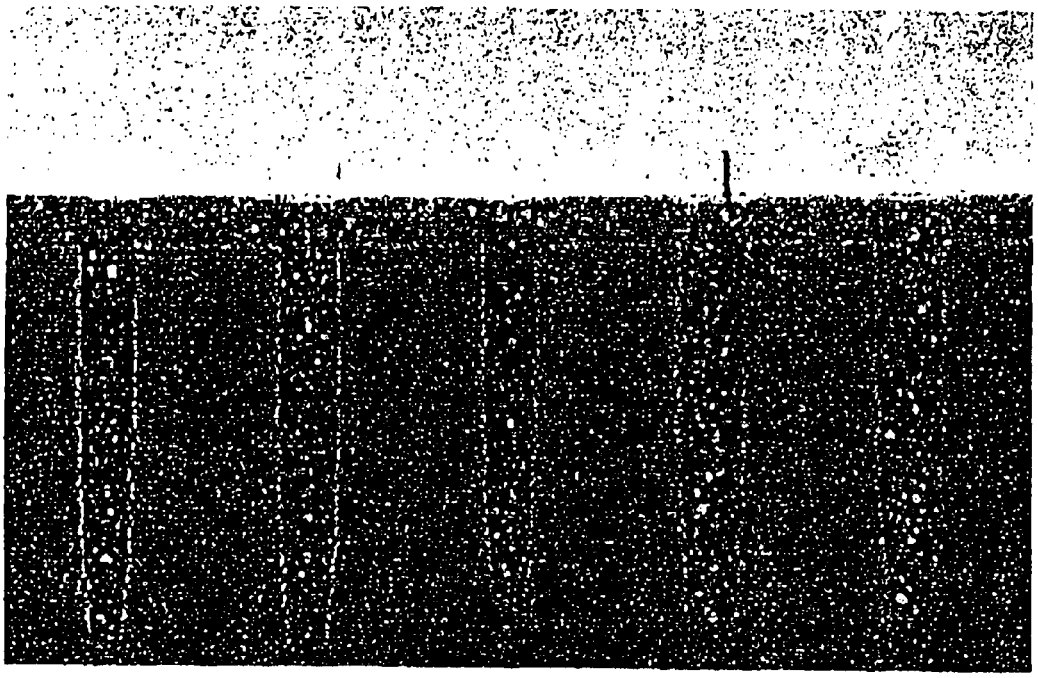
FIG. 2a is a scanning electron microscope (SEM) photograph depicting a cross-sectional view of a silicon wafer coated with a fill composition according to the invention as described in Example 1.
Figure 2B:
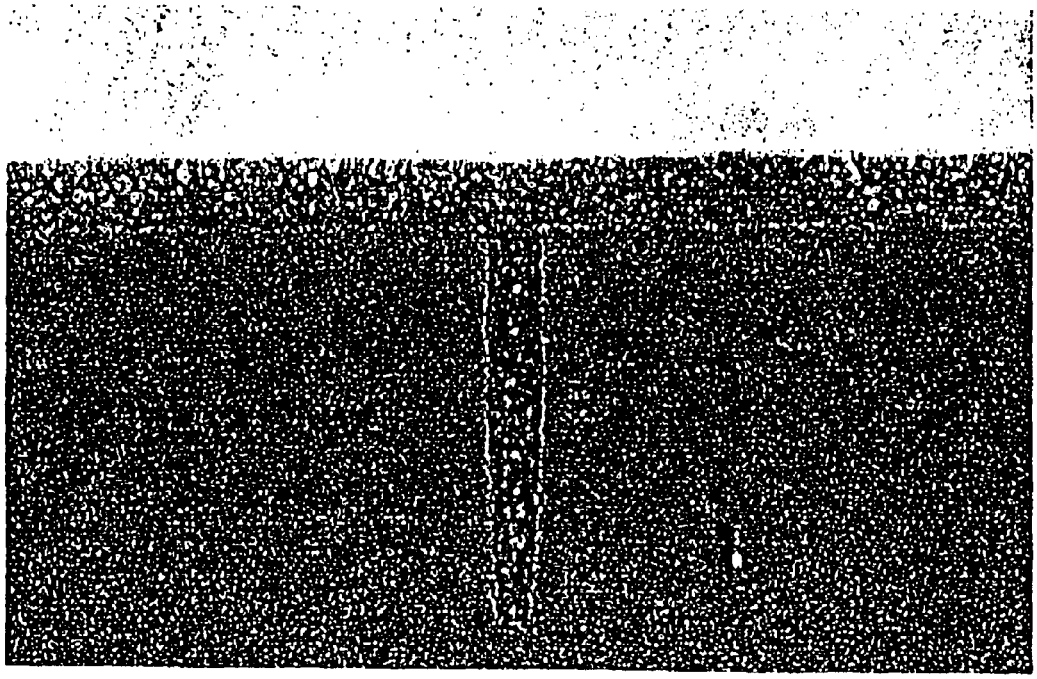
FIG. 2b is another SEM photograph depicting a cross-sectional view of a silicon wafer coated with the fill composition of Example 1.

The resulting composition was coated onto silicon wafers having vias by spin-coating at 400 rpm for 5 seconds followed by a cast spin at 1500 rpm for 60 seconds. The wafer was then baked at 205° C. for 60 seconds. Good surface coverage (400 to 900 Å) and full fill (1 μm) in vias with a diameter of 0.20 μm and a depth of 1.0 μm were obtained as evidenced by the SEM photographs shown in FIGS. 2a and 2b.

Example 2

Figure 3:
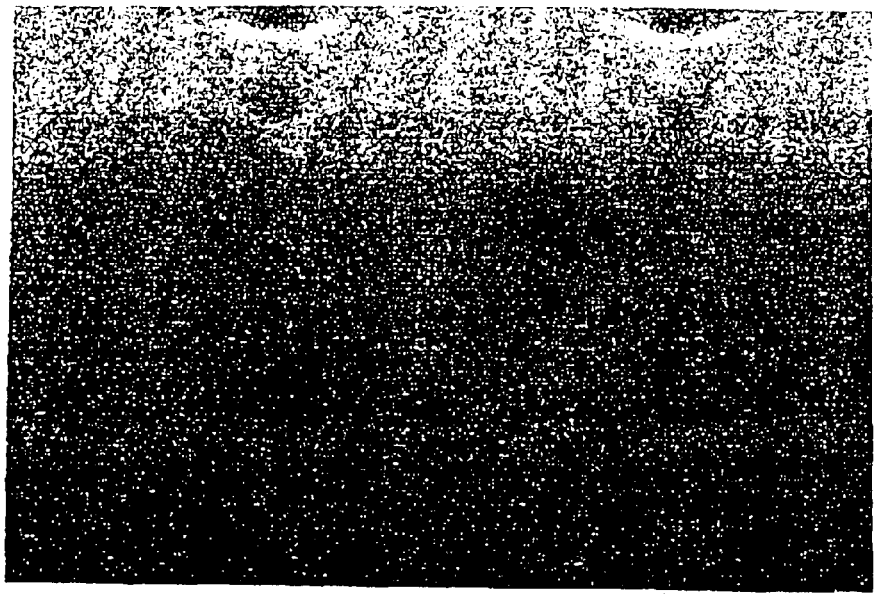
FIG. 3 is another SEM photograph depicting a cross-sectional view of a silicon wafer coated with the fill composition described in Example 2.

About 20 g of ARC-DUV42-6 (an acrylic anti-reflective coating, available from Brewer Science, Inc.) was blended with 30 g of the solution prepared in Example 1. The mixture was stirred for one hour and filtered through a 0.1 μm end point filter to yield a dual damascene via fill composition. Silicon chips having vias were coated with the composition by spin-coating at 400 rpm for 5 seconds followed by a cast spin at 1500 rpm for 60 seconds. The wafer was then baked at 205° C. for 60 seconds. Good surface coverage (650 Å) and full via filling (10,000 Å) in vias with a diameter of 0.2 μm and a depth of 1.0 μm were obtained as evidenced by the SEM photograph shown in FIG. 3.

Example 3

Figure 4:
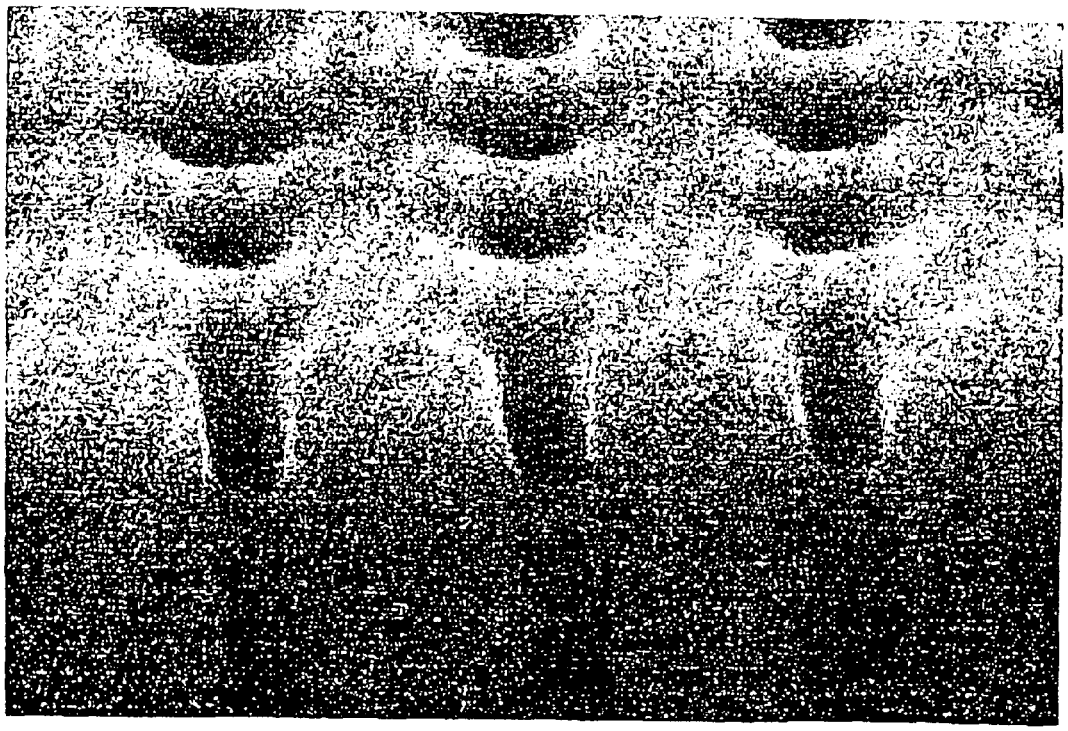
FIG. 4 is another SEM photograph depicting a cross-sectional view of a silicon wafer coated with a fill composition as described in Example 3.

About 30 g of ARC-DUV44-6 (an acrylic anti-reflective coating, available from Brewer Science, Inc.) was blended with 20 g of the solution prepared in Example 1. The mixture was stirred for one hour and filtered through a 0.1 μm end point filter to yield the dual damascene via fill composition. Silicon chips having vias were coated with the composition by different coating processes, depending upon the fill requirements. Good surface coverage (650 Å) and via filling (4700 Å) in vias with a diameter of 0.25 μm and a depth of 1.0 μm were obtained as evidenced by the SEM photograph shown in FIG. 4.

Example 4

In this example, 1.245 g of SAA-101 polymer (weight-average molecular weight of 2500) and 1.245 g of hydroxypropyl cellulose (Grade SSL obtained from Nisso Chemical, having a molecular weight range of 15,000–30,000) were added to 29.100 g of PGME and 67.900 g of PnP. Next, 495.0 mg of aminoplast crosslinking agent (POWDERLINK® 1174, available from Cytec Industries, Inc.) and 15.00 mg of TSA were added to the mixture, and the resulting solution was mixed for approximately 4 hours at room temperature until homogeneous. The solution was then ion exchanged by tumbling with 5 weight % PGME-washed Dowex 650C beads. The beads were removed by straining the solution through 2 layers of plastic mesh followed by filtering through a 0.1 μm end point.

Figure 5:
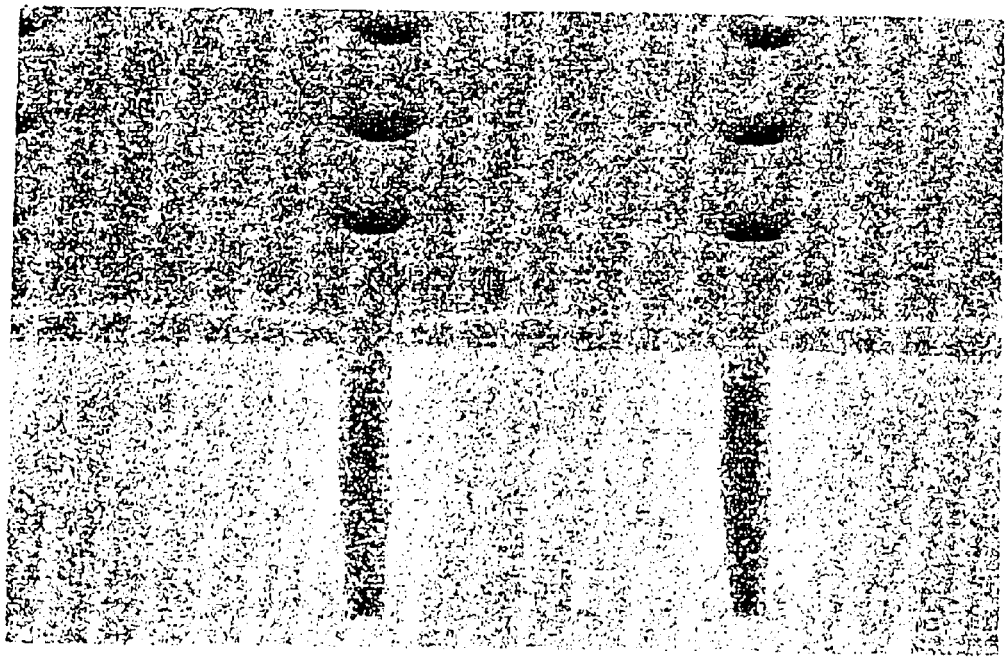
FIG. 5 is a further SEM photograph depicting a cross-sectional view of a silicon wafer coated with a fill composition as described in Example 4 wherein the wafer contains isolated vias.
Figure 6:
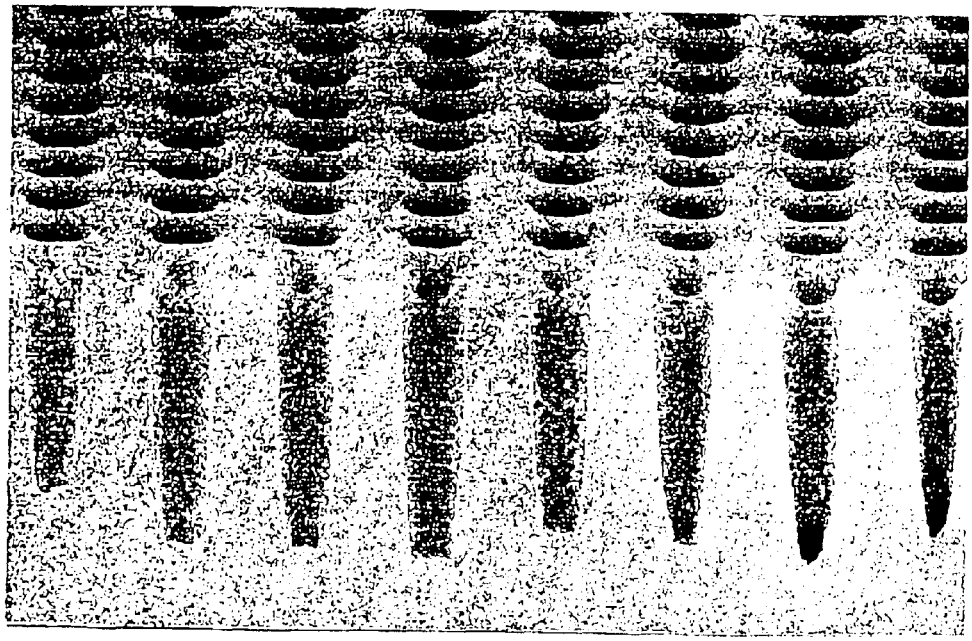
FIG. 6 is a further SEM photograph depicting a cross-sectional view of a silicon wafer having dense vias and coated with the fill composition described in Example 4.

The composition was spin-coated onto a quartered silicon wafer containing via holes which were 0.20×0.22 μm in diameter and 1 μm in depth. A dynamic dispense was utilized at 500 rpm for 5 seconds followed by a spread spin of 700 rpm for 25 seconds and then a cast spin at 1800 rpm for 30 seconds (20,000 rpm acceleration rates). SEM photographs of the respective cross-sections of the wafers are shown in FIGS. 5 and 6.

Example 5

In this example, 1.233 g of SAA-101 polymer (weight-average molecular weight of 2,500) and 1.233 g of polyacrylic acid (having a molecular weight of 2,000) were added to 29.096 g of PGME and 67.886 g of PnP. Next, 493.1 mg of aminoplast crosslinking agent (POWDERLINK® 1174), 9.24 mg of TSA, and 49.3 mg of 4,4'-sulfonyldiphenol were added to the mixture, and the resulting solution was mixed for approximately 2 hours at room temperature until homogeneous. The solution was then ion exchanged by tumbling with 5 weight % PGME-washed Dowex 650C beads. The beads were removed by straining the exchange solution through 2 layers of plastic mesh followed by filtering through a 0.1 μm end point.

Figure 7:
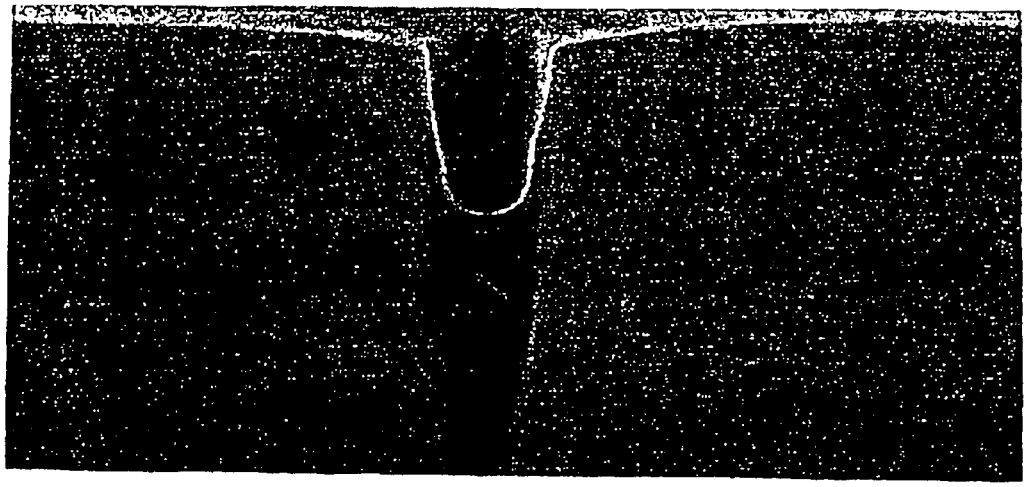
FIG. 7 is another SEM photograph depicting a cross-sectional view of a silicon wafer having isolated vias which are partially filled with the fill composition of Example 5.
Figure 8:
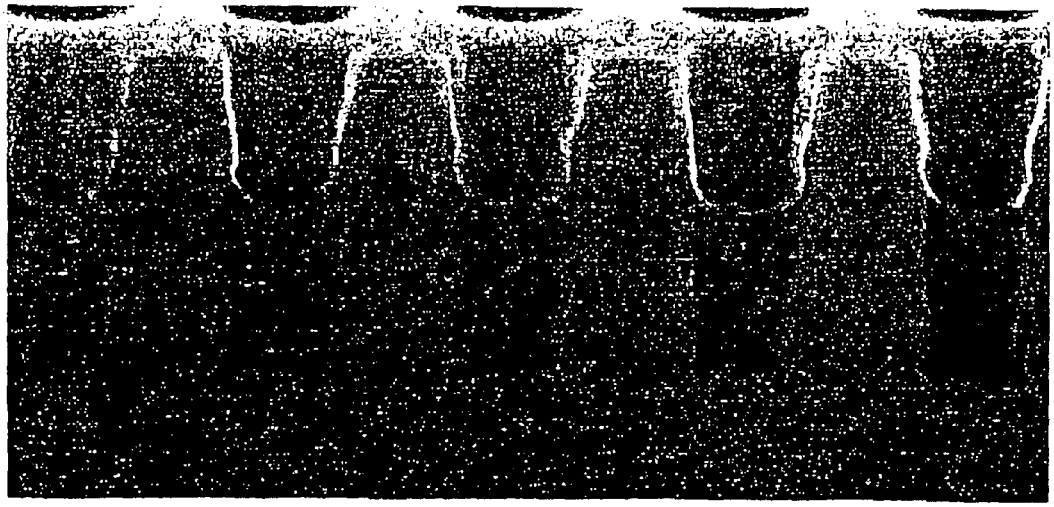
FIG. 8 is yet another SEM photograph depicting a cross-sectional view of a silicon wafer having dense vias which are partially filled with a fill composition as described in Example 5.

The composition was spin-coated onto a quartered silicon wafer containing via holes which were 0.20×0.22 μm in diameter and 1 μm in depth. A dynamic dispense was utilized at 500 rpm for 5 seconds followed by a spread spin of 700 rpm for 25 seconds and then a cast spin at 1800 rpm for 30 seconds (20,000 rpm acceleration rates). FIGS. 7 and 8 show SEM photographs of cross-sections of these wafers.

Example 6

Anti-Reflective Coating—Hydroxypropyl Cellulose

1. Preparation of Mother Liquor

A 500 mL three-necked flask equipped with a condenser and magnetic stirring bar was charged with 15.0 g of hydroxypropyl cellulose (Grade SSL, obtained from Nisso Chemical), 15.0 g. of poly(styrene/allyl alcohol) (SAA-101, from Lyondell Chemical), and 270.0 g of PnP. The mixture was stirred at 69.5–100° C. for 39 hours to homogeneity.

2. Preparation of Anti-Reflective Coating

About 75 g of the mother liquor prepared in Part 1 of this example, 218.1 g of PnP, 3.78 g of POWDERLINK® 1174, 157 mg of TSA, and 472 mg of 4,4'-sulfonyldiphenol were stirred under ambient conditions to form a solution. The solution was then tumbled with 14.9 g of PGME-washed 650C deionization beads for 4 hours followed by filtering.

3. Properties of Anti-Reflective Coating

The anti-reflective coating prepared in Part 2 of this example was applied to silicon and quartz wafers by spin-coating at 2500 rpm for 60 seconds followed by curing at 205° C. for 60 seconds with hotplate vacuum. The composition had good coating quality. The film thickness was 848 Å, and the optical density at 193 nm was 11.65/μm. The resistance of the film to solvents was determined by puddling a solvent (ethyl lacetate) onto the film for 5–10 seconds, followed by spin-drying at 5000 rpm for 30 seconds to remove the solvent. The film was then baked on a hotplate at 100° C. for 30 seconds. The film thickness was measured at multiple points on the wafer using ellipsometry. The amount of stripping was determined to be the difference between the initial and final average film thickness. There was only 0.02% ethyl lactate stripping of this film.

The composition also had good spin-bowl compatibility. That is, the room temperature-dried anti-reflective coating readily re-dissolved in commonly encountered solvents at room temperature. The etch selectivity to 193 nm resist (PAR 710, Sumitomo Chemical Co.) using $HBr/O_2$ (60/40) as the etch gas was 1.2.

A 193 nm photoresist (PAR 710) was applied over 853 Å of the cured anti-reflective layer and soft baked at 130° C. for 60 seconds. Exposures were carried out with an ASML PAS5500/950 scanner (NA=0.63; Sigma=0.75) at exposure energies for 8.3 mJ/cm$^2$. A post-exposure bake was carried out at 130° C. for 60 seconds. The photoresist was then developed with OPD262 developer (obtained from ARCH Semiconductor Chemicals) for 60 seconds.

Figure 9:
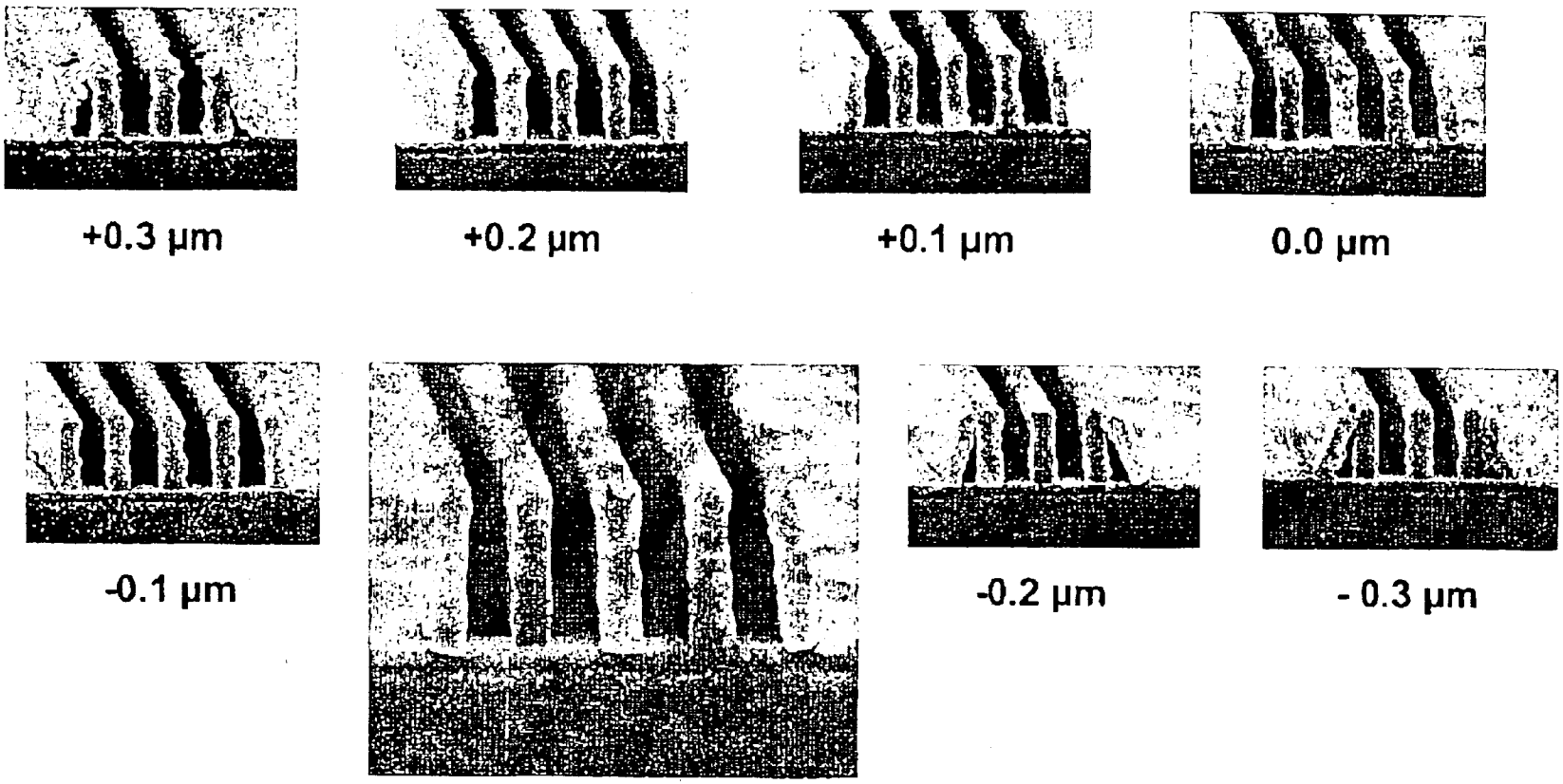
FIG. 9 is a series of SEM photographs depicting a cross-sectional view of a silicon wafer having 0.13 μm dense L/S coated with the composition described in Example 6 and a commercially available photoresist composition.

The SEM photographs (FIG. 9) showed that at an exposure dose of 8.3 mJ/cm$^2$ the sample had good 0.13 μm dense L/S (line/space) patterns with minimal footing or undercut. Depth-of-focus (DOF) was about 0.4 μm.

Example 7

Anti-Reflective Coating—Cellulose Acetate Hydrogen Phthalate

1. Preparation of Mother Liquor

About 16.0 g of cellulose acetate hydrogen phthalate (CAHP, obtained from Aldrich, product number 32,807-3), 8.62 g of poly(styrene/allyl alcohol) (SAA-101), and 221.5 g of PGMEA in a Nalgene bottle were tumbled on a wheel or sometimes magnetically stirred for 3 days at ambient conditions and then heated with magnetic stirring to 100° C. to give a solution containing only traces of insolubles.

2. Preparation of Anti-Reflective Coating

About 75.0 g of the mother liquor prepared in Part 1 of this example, 126.1 g of PnP, 56.1 g of PGMEA, 2.49 g of POWDERLINK® 1174, 103.5 mg of TSA, and 310 mg of 4,4'-sulfonyldiphenol were stirred under ambient conditions to homogeneity. The solution was then tumbled with 13.0 g of PGME-washed 650C deionization beads for 4 hours at ambient conditions to effect deionization. The beads were removed by straining through a plastic mesh, and the anti-reflective coating was then filtered through a 0.2 μm end point filter.

3. Properties of Anti-Reflective Coating

The anti-reflective coating prepared in Part 2 of this example was applied to silicon and quartz wafers by spin-coating at 2500 rpm for 60 seconds followed by curing at 205° C. for 60 seconds with hotplate vacuum. The film thickness was 967 Å, and the optical density was 13.2/μm at 193 nm. There was no ethyl lactate stripping of this film, nor was there any hotplate smoking during the bake step. The anti-reflective coating had good spin-bowl compatibility, and the etch selectivity to resist (PAR 101) using $HBr/O_2$ (60/40) as the etch gas was 1.1.

Figure 10:
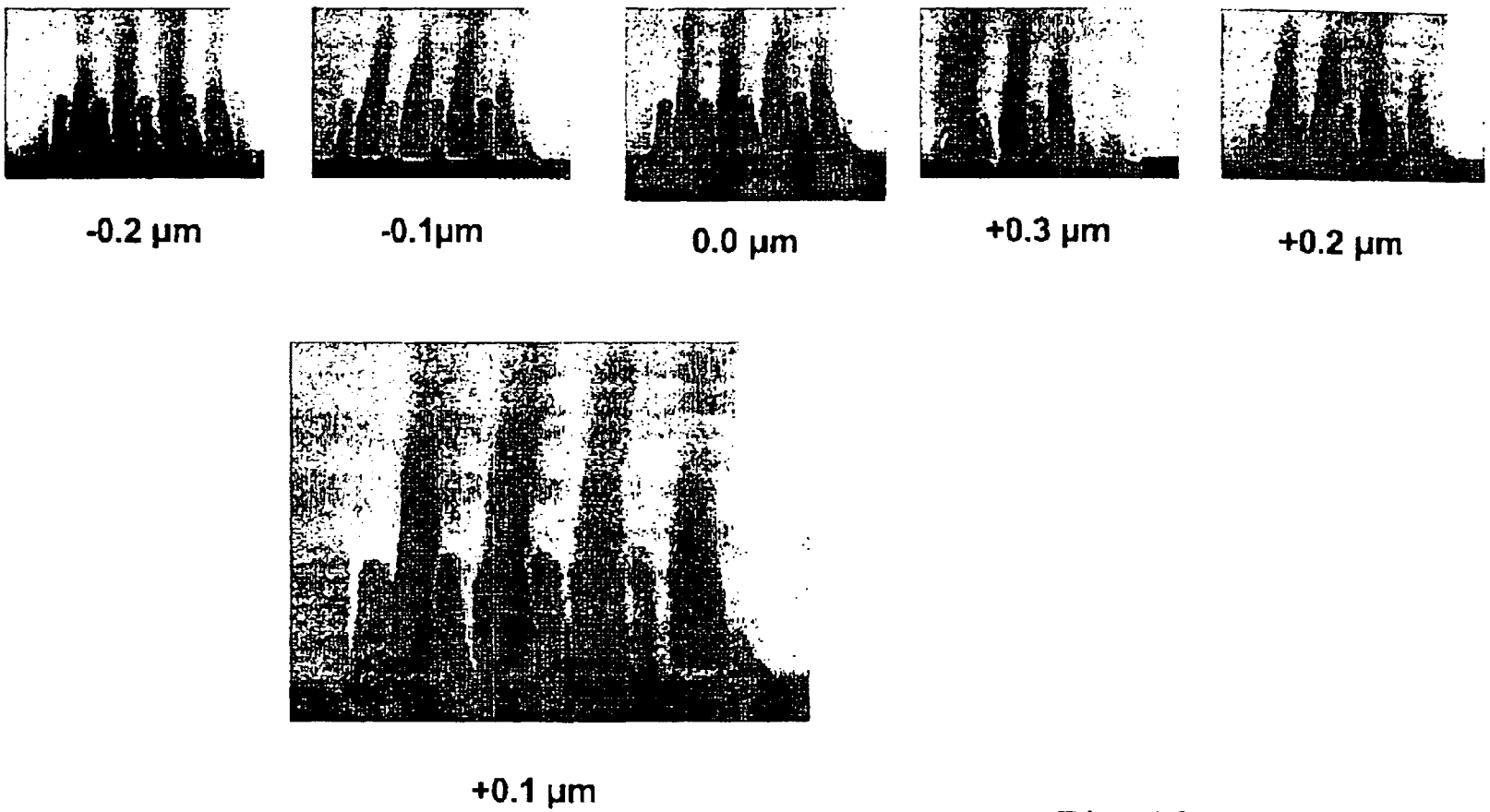
FIG. 10 is a series of SEM photographs depicting a cross-sectional view of a silicon wafer having 0.13 μm dense L/S coated with the composition described in Example 7 and a commercially available photoresist composition.

A 193 nm photoresist (PAR 710) was applied to the cured anti-reflective layer and soft baked at 130° C. for 60 seconds. Exposures were carried out with an ASML PAS5500/950 scanner (NA=0.63; Sigma=0.75) at exposure energies of 10.1 mJ/cm$^2$. A post-exposure bake was carried out at 130° C. for 60 seconds. The photoresist was then developed with OPD262 developer (obtained from ARCH Semiconductor Chemicals) for 60 seconds. Very good 0.13 μm dense L/S patterns were obtained, with about 0.5 μm satisfactory DOF. FIG. 10 shows the SEM photographs of this sample.

We claim:

1. In an anti-reflective or fill composition for protecting a base material or holes formed in a base material, the improvement being that said composition comprises a styrene-allyl alcohol polymer and a polymer selected from the group consisting of cellulose polymers, novolaks, and mixtures thereof, *wherein said polymers are dispersed in a solvent system, said solvent system being utilized at a level from about 80-98% by weight, based on the total weight of composition taken as 100% by weight.*

2. The composition of claim 1, wherein said [polymers are dispersed in a] solvent system [which] includes a solvent selected from the group consisting of 1-methoxy-2-propanol, PGMEA, PGME, propylene glycol n-propyl ether, 2-heptanone, N-methylpyrollidinone, ethyl lactate, and mixtures thereof.

3. The composition of claim 1, wherein said composition comprises from about 1–10% by weight styrene-allyl alcohol polymer, based upon the total weight of the composition taken as 100% by weight.

4. The composition of claim 1, wherein said styrene-allyl alcohol polymer comprises from about 40–90% by weight styrene, based upon the total weight of the styrene-allyl alcohol polymer taken as 100% by weight.

5. The composition of claim 1, wherein said styrene-allyl alcohol polymer comprises from about 10–60% by weight allyl alcohol, based upon the total weight of the styrene-allyl alcohol polymer taken as 100% by weight.

6. The composition of claim 1, wherein the molar ratio of styrene to allyl alcohol is from about 0.4:1 to about 4:1.

7. The composition of claim 1, wherein said composition further comprises a compound selected from the group consisting of crosslinking agents, catalysts, light attenuating compounds, and mixtures thereof.

8. The composition of claim 7, wherein said compound is an aminoplast crosslinking agent.

9. The composition of claim 7, wherein said compound is a catalyst selected from the group consisting of p-toluenesulfonic acid, bisphenol-A, 4,4'-sulfonyldiphenol, pyridinium p-toluenesulfonate, and mixtures thereof.

10. The composition of claim 1, wherein said composition comprises from about 0.5–10% by weight of said additional polymer, based upon the total weight of the composition taken as 100% by weight.

11. The composition of claim 1, wherein said styrene-allyl alcohol polymer has a weight average molecular weight of from about 1000–10,000 Daltons.

* * * * *